United States Patent [19]

Schulz et al.

[11] Patent Number: 4,524,396
[45] Date of Patent: Jun. 18, 1985

[54] PLAYBACK PREAMPLIFIER FOR MAGNETIC TAPE RECORDINGS

[75] Inventors: Axel Schulz, Bickenbach; Josef Sochor, Dieburg, both of Fed. Rep. of Germany

[73] Assignee: Robert Bosch GmbH, Stuttgart, Fed. Rep. of Germany

[21] Appl. No.: 524,684

[22] Filed: Aug. 19, 1983

[30] Foreign Application Priority Data

Sep. 2, 1982 [DE] Fed. Rep. of Germany ....... 3232610

[51] Int. Cl.³ .............................................. G11B 5/02
[52] U.S. Cl. ..................................................... 360/67
[58] Field of Search ..................... 360/67, 65; 330/124, 330/84, 255, 260, 291

[56] References Cited

U.S. PATENT DOCUMENTS

| 3,032,719 | 5/1962 | Beck | 360/67 |
| 3,068,327 | 12/1962 | Davidson | 360/67 |
| 3,465,321 | 9/1969 | Reisfeld | 360/67 |
| 4,357,637 | 11/1982 | Gilbert | 360/67 |
| 4,389,683 | 6/1983 | LeLandais | 360/67 |

Primary Examiner—Vincent P. Canney
Attorney, Agent, or Firm—Frishauf, Holtz, Goodman & Woodward

[57] ABSTRACT

For every playback head (6) on the head wheel (1) a sector (5) of the head wheel disk carries a preamplifier consisting of two amplifier branches operating in phase opposition, each having an input transistor stage of the grounded emitter configuration and an output transistor stage of the grounded collector configuration (sometimes referred to as an emitter follower). Both stages have voltage negative feedback. The outputs of the amplifying branches are respectively connected to opposite ends of a rotary primary coil of a multiple transformer serving to couple the rotating preamplifier circuits to stationary outputs. Blocking capacitors prevent the flow of equalizing currents in the event of any deviations from electrical symmetry. The circuit is usable for playback of recordings in the form of digital signals picked up at a rate of 2 megabits per second.

5 Claims, 3 Drawing Figures

PLAYBACK PREAMPLIFIER FOR MAGNETIC TAPE RECORDINGS

This invention concerns playback preamplifiers for recording and reproducing equipment using magnetic tape as the recording medium in which at least the playback heads are mounted on the periphery of a rotary head wheel which carries a preamplifier for each head and the corresponding rotary windings of an inductive transmission device of which the output windings are stationary. The portion of the equipment which relates to reproducing the recorded material is commonly referred to as the "playback" portion for short.

Such a recording and reproducing equipment is known, for example, from German published patent application (OS) No. 18 00 799. As there disclosed, active electronic circuits, for example, amplifying circuits, are located on the rotating magnetic head carrier. In the system there proposed amplification of frequency modulated signals was to be produced by the use of integrated circuit technology. The provision of such circuits, however, required development and production of circuits of considerable complication and great expense, which is particularly disadvantageous for models of equipment sold in only moderate quantity, as for example studio equipment.

A rotating magnetic head arrangement utilizing a ring-shaped head rotor is disclosed in German published patent publication (OS) No. 24 11 402. The head rotor is mounted hydrostatically in a ring-shaped cavity of the stationary core portion of a tape scanning equipment. According to an example there described, circuits for the amplification of the picked-up signals are provided in or on the head rotor. In this case the possibility of contactless transmission of signal and supply voltages was contemplated. The ring-shaped constitution of the rotor with the circling magnetic heads introduces bearing and weight problems, however, which are not easily overcome and as a result the flat disk type magnetic head rotors have since become preferred.

SUMMARY OF THE INVENTON

It is an object of the present invention to provide a playback preamplifier suitable for a magnetic pickup head wheel of the disk type on which the heads are at the periphery of the disk, utilizing circuits that are constituted with few discrete elements such that a complete set of preamplifiers for the playback heads can be provided on the head wheel. It is a further object of the invention to provide the circuits with a high degree of symmetry so that electrostatic and electrodynamic balance is obtainable for the various playback circuits as well as a high degree of mechanical balance and a low moment of inertia for the rotor as a whole.

Briefly, each preamplifier has a symmetrical pair of amplifier branches, each branch of the pair composed of a grounded emitter transistor circuit followed by a grounded collector transistor circuit, both these transistor circuits being provided with negative feedback voltage, as typically accomplished by the provision of a feedback resistance, from collector to base in the first case and from emitter to ground in the second. The coupling between the two stages is preferably direct coupling through a resistor. The symmetrical amplifying branches of a pair operate in phase opposition and it is convenient, but not necessary, to use a center tapped pickup winding on the magnetic head.

The preamplifier circuit of the invention has the advantage that it can be constituted of just a few discrete elements and can fit on the head wheel disk even in a multiple array serving all the heads on the wheel. There is the further advantage that the discrete circuit components have low mass so that they can readily withstand the stresses of high speeds of rotation of the disk. Furthermore, because of the symmetrical circuit design there is an extraordinarily good common mode suppression of disturbances from other signal sources. Because of the simple resistance coupling between the stages the circuit can readily be built for broadband transmission in a form which has no parasitic oscillation tendencies.

To avoid current unbalances of the circuit it is advantageous to provide input coupling capacitors on the grounded emitter stages and to insert an output coupling capacitor in series with the rotary winding of the output transformer to which the output of a pair of amplifier branches of the preamplifier of the invention is connected.

The preamplifier of the invention is particularly well-suited for the reproduction of tape recorded digital signals at the high bit rate of, for example, 100 megabits per second.

BRIEF DESCRIPTION OF THE DRAWINGS

The invention is further described by way of illustrative example with reference to the annexed drawings, in which.

DESCRIPTION OF THE PREFERRED EMBODIMENTS

Figure 1:
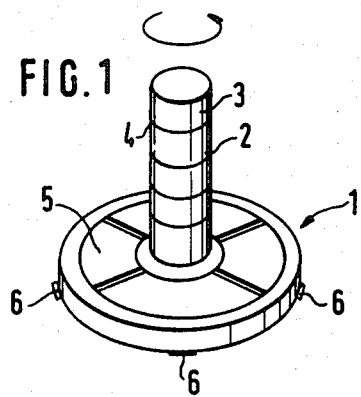
FIG. 1 is a schematic perspective view of a playback head wheel rotor on which the playback preamplifiers according to the invention are located.

FIG. 1 shows a head wheel disk 1 combined in a known way with an inductive device 2 for transmission of signals from rotary windings to stationary windings, the stationary windings not being shown in this case. The head wheel and the rotary windings are combined into a single rotor unit. Four magnetic heads 6 are disposed on the periphery of the head wheel disk 1 and corresponding to them on the flat surface of the disk are four segments 5 in each of which is located a playback preamplifier circuit according to the invention, the details of which are not shown in FIG. 1. The inductive transmission device 2 has a number of transformer parts that are shielded one from the other by shielding 4 made of a suitable material, for example mu-metal.

Figure 2:
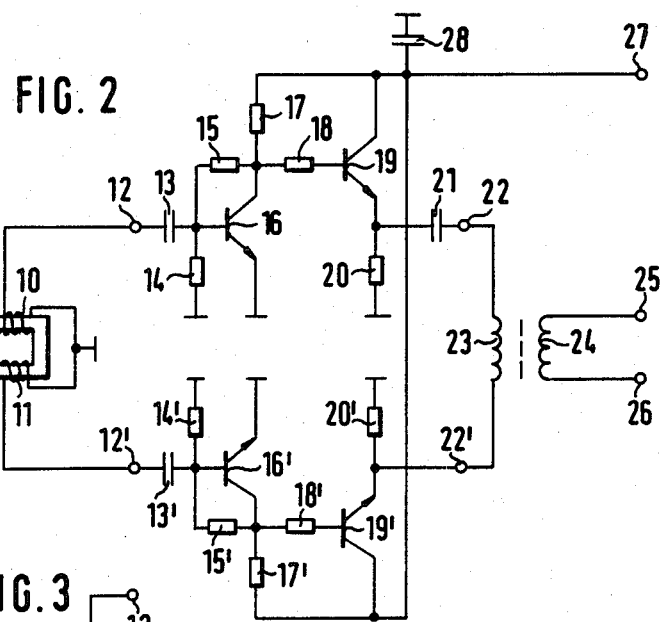
FIG. 2 is a circuit diagram of an embodiment of the playback preamplifier for one head of the head wheel of FIG. 1.

FIG. 2 shows the circuit of a preamplifier according to the invention. The magnetic head 6 has two partial windings 10 and 11 that are connected in series. The connection point is connected to ground potential or an equivalent reference potential, such as equipment chassis frame potential or the like. The outer ends of the windings 10 and 11 are respectively connected to the input terminals 12 and 12' of the amplifier circuit. The signal induced in the winding 10 by magnetization of the magnetic tape moving past the head 6 is applied to the base of the transistor 16 through a coupling capacitor 13 and is similarly applied with opposite polarity to the base of the transistor 16'.

Since the amplifier circuits are constructed fully identical, in what follows the amplifier circuit consisting of the elements 13 to 20 is described and any additional explanation of the circuit consisting of the elements 13' to 20' is unnecessary. The transistor 16 is connected in what is usually called a grounded emitter circuit. It makes possible both current and voltage amplification, so that a maximum of power amplification compared to the other basic transistor circuit is obtained. The resistances 15 and 14 provide bias voltage for the base electrode by voltage divider action and at the same time provide negative voltage feedback.

The amplified signal passes from the collector of the transistor 16, over a resistance 18 that serves merely to prevent high-frequency oscillations, to the base of the transistor 19. The latter is connected as an emitter follower, the one of the three most basic transistor circuits which also has the name "grounded collector circuit". The load resistance 20 is connected between the emitter of the transistor 19 and ground—the ground connection being to the apparatus frame or casing, in this case being made through the disk 1 or a layer thereon. The primary winding 23 of the rotating portion of a rotary-to-stationary inductive coupling (transformer) has its ends connected to the outputs 22,22' of the two amplifying branch circuits shown in FIG. 2 (one having the elements 13 to 20 and the other having the elements 13' to 20'). The primary winding is on the rotor part 2 shown in FIG. 1 and in fact there is such a primary winding, shown as a separate segment 3, for each of the magnetic heads 6.

The secondary winding 24 is arranged in the stationary part of the scanning assembly. From the connectors 25 and 26 the amplified signal can be taken for further processing.

In order to prevent the flow through the winding 23 of d.c. a balance current resulting from differences between the amplifier circuits 13–20 and 13'–20', a blocking capacitor 21 is interposed in series with the primary winding 3 of the rotary-to-stationary transformer. Such balance currents would provide an unnecessary loading of the transformer that would generate heat as well as an unsymmetrical magnetization. The supply of an operating voltage of, for example, 12 volts is shown at 27, this supply being bypassed to ground by a capacitor 28.

Figure 3:
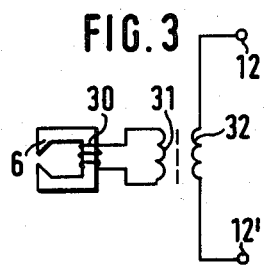
FIG. 3 is a circuit diagram of a modification of the circuit of FIG. 2.

A magnetic head winding with a grounded center tap, as shown in FIG. 2, of course provides good symmetry of the signals supplied to the two inputs of the respective mutually symmetrical amplifying branches shown in FIG. 2. Basically it is, nevertheless, also possible to utilize heads with a single winding, such as shown in FIG. 3, and to connect these through a transformer 31, 32 with the terminals 12 and 12' shown in FIG. 2. Finally, if there is a sufficiently high output voltage from the winding 30, the transformers 31, 32 can be omitted and the winding 30 can be directly connected to the terminals 12 and 12'.

It will therefore be seen that variations and modifications of the embodiments shown are possible within the inventive concept.

We claim:

1. Playback preamplifier for a magnetic tape recorder-reproducer equipment of the kind having playback magnetic heads mounted on the periphery of a rotating disk, rotary windings rotating with said disk of an inductive system for transmitting broadband signals from said rotating windings to stationary circuits and preamplifer circuits interposed between said respective winding heads and rotary windings incorporating the improvement wherein:

the preamplifier circuits respectively serving said heads are each constituted of two symmetrical amplifier branches, each said amplifier branch has, in cascade, a grounded emitter stage having broadband negative voltage-feedback and a grounded collector stage having broadband feedback generated by current in an emitter-connected load resistor the outputs of said grounded collector stages of the amplifier branches of each of said preamplifier circuits being connected to a corresponding rotary winding of said inductive transmission system.

2. Playback preamplifier according to claim 1, for use with heads having a center-tapped pick-up winding, the center-tap of which is connected with a fixed reference potential, in which preamplifier blocking capacitors (13, 13') are interposed respectively between the ends of said pick-up winding and the base electrodes of the grounded emitter stages of said pair of symmetrical amplifier branches of said preamplifier.

3. Playback preamplifier according to claim 1, in which an input transformer (31) and a pair of blocking capacitors (13, 13') are provided in an input circuit common to every symmetrical pair of amplifier branches, said transformer having primary and secondary windings, said primary winding being connected to the pick-up winding of one of said heads, said blocking capacitors being respectively interposed between the ends of said secondary winding and the base electrodes of the respective grounded emitter stages of said amplifier branches.

4. Playback preamplifier according to claim 2, in which a blocking capacitor is interposed in series with the outputs of said outputs of said grounded collector stages and the corresponding rotary winding of said inductive transmission system.

5. Playback preamplifier according to claim 3, in which a blocking capacitor is interposed in series with the outputs of said outputs of said grounded collector stages and the corresponding rotary winding of said inductive transmission system.

* * * * *